United States Patent [19]

Klank

[11] 4,114,100
[45] Sep. 12, 1978

[54] RAPID TUNING CIRCUIT FOR HIGH FREQUENCY RECEIVERS

[75] Inventor: Otto Klank, Arpke, Fed. Rep. of Germany

[73] Assignee: Licentia Patent-Verwaltungs-G.m.b.H., Frankfurt am Main, Fed. Rep. of Germany

[21] Appl. No.: 814,103

[22] Filed: Jul. 8, 1977

[30] Foreign Application Priority Data

Jul. 16, 1976 [DE] Fed. Rep. of Germany ....... 2632025

[51] Int. Cl.² .............................................. H04B 1/16
[52] U.S. Cl. .................................... 325/453; 325/420; 325/464
[58] Field of Search ............... 325/420, 421, 422, 453, 325/464, 468, 459

[56] References Cited

U.S. PATENT DOCUMENTS

| | | | |
|---|---|---|---|
| 3,822,405 | 7/1974 | Sakamoto | 325/464 |
| 3,846,707 | 11/1974 | Sakamoto et al. | 325/453 |
| 3,913,020 | 10/1975 | Van Anrooy | 325/453 |
| 3,942,121 | 3/1976 | Bell et al. | 325/464 |
| 3,962,640 | 6/1976 | Bomba | 325/421 |
| 4,004,232 | 1/1977 | Amaya | 325/464 |

Primary Examiner—Robert L. Griffin
Assistant Examiner—Marc E. Bookbinder
Attorney, Agent, or Firm—Spencer & Kaye

[57] ABSTRACT

A tuning circuit for a high frequency receiver in which the received frequency is determined by a voltage-controlled oscillator, the present tuning frequency is indicated by a counter connected to the oscillator and producing a representation of each digit of the decimal number identifying the current received frequency, representations of the digits of the number identifying the desired received frequency are fed in via a keyboard, and the decimal number representations are compared in a comparator to produce a control voltage that brings the oscillator frequency to the desired value, and in which the comparator is capable of comparing only one digit of the number representations at a time and receives the digits of corresponding significance in sequence, starting with the most significant digit, and the rate at which the control voltage is varied is made inversely proportional to the number of changes in the direction of the inequality of the digits of one of the number representations being compared relative to the corresponding digits of the other number representation being compared.

11 Claims, 5 Drawing Figures

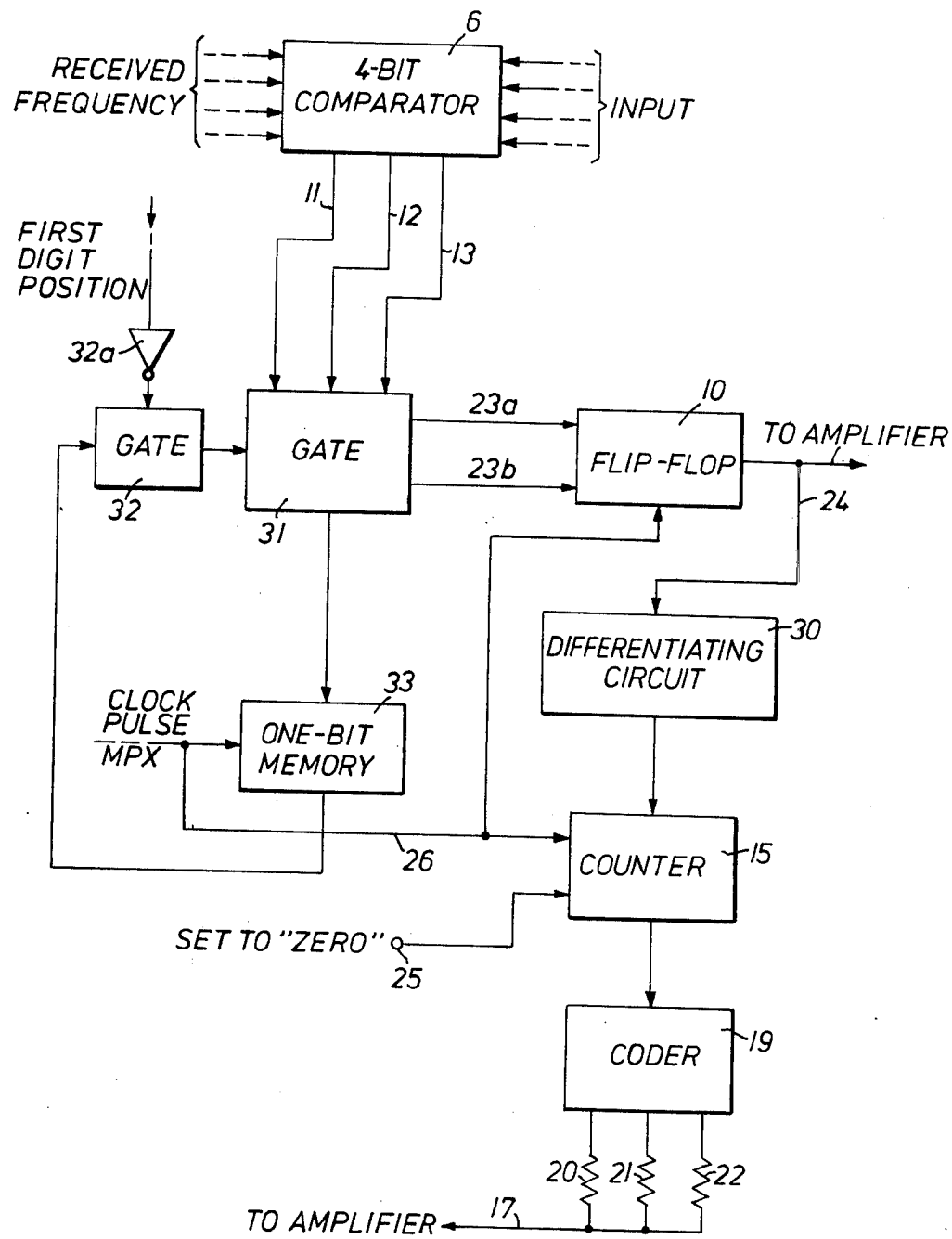

| STATE NO. | $Q_1$ | $Q_2$ | OUTPUT GATE: 34 | 35 | 36 |
|---|---|---|---|---|---|
| 1 | 0 | 0 | 1 | 0 | 0 |
| 2 | 0 | 1 | 0 | 0 | 1 |
| 3 | 1 | 0 | 0 | 1 | 0 |
| 4 | 1 | 1 | 0 | 0 | 0 |

RAPID TUNING CIRCUIT FOR HIGH FREQUENCY RECEIVERS

BACKGROUND OF THE INVENTION

The present invention relates to a tuning circuit for a high frequency receiver having a superheterodyne oscillator whose frequency can be varied by means of a tuning voltage in order to tune the receiver to a desired station.

In such circuits, the tuning voltage, which is a direct voltage, is generated by a comparison circuit which effects a comparison between two numbers. The first number identifies the counter state of a counting device which periodically counts the oscillations of the superheterodyne oscillator on the basis of the intermediate frequency. This number thus constitutes the received frequency, or possibly the received channel or station. The second number is fed to the comparison circuit via an input keyboard provided with a series-connected coder and identifies the desired channel or station to which the receiver is to be tuned. The comparison circuit has three outputs, one output for the comparison result "equality" and one each for the two non-equality results "greater" and "less".

In the circuit disclosed in U.S. application Ser. No. 708,754, filed by the present applicant and Dieter Rottmann and Stephan Wuttke on July 26, 1976, the comparison is effected by a multiplex operation and the comparison circuit is composed of only a single comparator which can effect a comparison with respect to only one digit, or level of significance, of the numbers at a time. This comparator receives, in succession, the representations of the digits of the two numbers to be compared, beginning with the most significant digit.

If in the described tuning circuit the two numbers are unequal, the tuning circuit, and thus the frequency of the superheterodyne oscillator, is changed until the frequency identified by the number fed in has been attained. The rate at which the tuning voltage changes is relatively great if the two numbers to be compared differ from one another in all digit positions. The rate of change becomes less as more digits of the two numbers, beginning with the most significant digit, become equal. When all digits are equal, the frequency will no longer be changed. The tuning rate thus decreases as more digits become identical, this result being a function of the evaluation circuit provided in the above-cited application. The successive rates there are proportional to $\frac{1}{2}$ ... $1/n$, where $n$ = number of digit positions, e.g. 5. It has been found that this tuning process takes a relatively long time, which many operators consider to be a drawback.

SUMMARY OF THE INVENTION

It is therefore an object of the present invention to shorten the time required for the tuning process.

These and other objects are achieved, in a tuning circuit for a high frequency receiver, which circuit includes a voltage controllable superheterodyne oscillator arranged to receive a control voltage and to produce an oscillation whose frequency is determined by the value of the control voltage and determines the broadcast frequency to which the receiver is tuned, a counter connected to sense the frequency of the oscillations being generated by the oscillator and to produce therefrom a count state in the form of representations of the digits of a first decimal number identifying the broadcast frequency to which the receiver is currently tuned, input means for generating representations of the digits of a second decimal number identifying the broadcast frequency to which it is desired to tune the receiver, and a comparison circuit for comparing the decimal number representations being produced by the counter and the input means in order to vary the control voltage in a direction to cause those two number representations to coincide, the comparison circuit including a comparator capable of comparing the representations of one digit of each of two numbers and having two inputs connected, respectively, to the counter and to the input means, the comparator being arranged to receive, at one of its inputs, each digit representation produced by the counter, starting with the most significant digit, and, at the other of its inputs, simultaneously therewith each digit representation of corresponding significance generated by the input means, the comparator including a first output providing a signal when the digit representations at its inputs are identical, a second output providing a signal when the digit representation at its one input represents a value larger than that of the digit representation at its other input, and a third output providing a signal when the digit representation at its one input represents a value smaller than that of the digit representation at its other input, by the provision of tuning voltage adjustment means connected to the comparator outputs and responsive to the number of sequences of termination of a signal at one of the second and third outputs and subsequent initiation of a signal at the other of the second and third outputs for varying the control voltage at a rate inversely proportional to such number of sequences.

Thus, in the present invention, the number of reversals of the inequality results determines the respective level of the rate of change of the tuning voltage. The greater the number of changes in inequality results, i.e. the smaller the difference between the two numbers, the lower will be the tuning rate.

In the tuning circuit described in the above-cited earlier U.S. application, there is also a reduction in the tuning rate as a result of different stages of the rate of change, but the differences between the various stages are only slight. The reason for this is that the tuning voltage which effects a change in frequency is generated by means of an integrating member, or low-pass filter, from pulses which vary in repetition rate by a maximum of, for example, 1:5 per unit time, corresponding to the number of digit positions. The direct voltage at the output of the integrating member can therefore only take on values which correspond to a linear graduation 0, 1, 2, ... $n$.

In the present invention, however, it is possible to provide practically any difference between the stages, or graduated variations, in the rate of change so that the tuning process can be optimized.

The periodical "Funkschau" 1974, Issue No. 3, at page 93, discloses a circuit which assigns different significances to individual decades during the comparison of two numbers associated with generation of the tuning voltage. However, this comparison of the two numbers is not performed in a multiplex operation but in a parallel operation. Therefore each decade must have its own comparator, causing the known tuning circuit to be very expensive.

The present invention enables optimum graduation to be achieved in the tuning rate with a multiplex comparison circuit.

BRIEF DESCRIPTION OF THE DRAWINGS

FIG. 2 is a circuit diagram of a portion of the circuit of FIG. 1.

DESCRIPTION OF THE PREFERRED EMBODIMENTS

Figure 1:
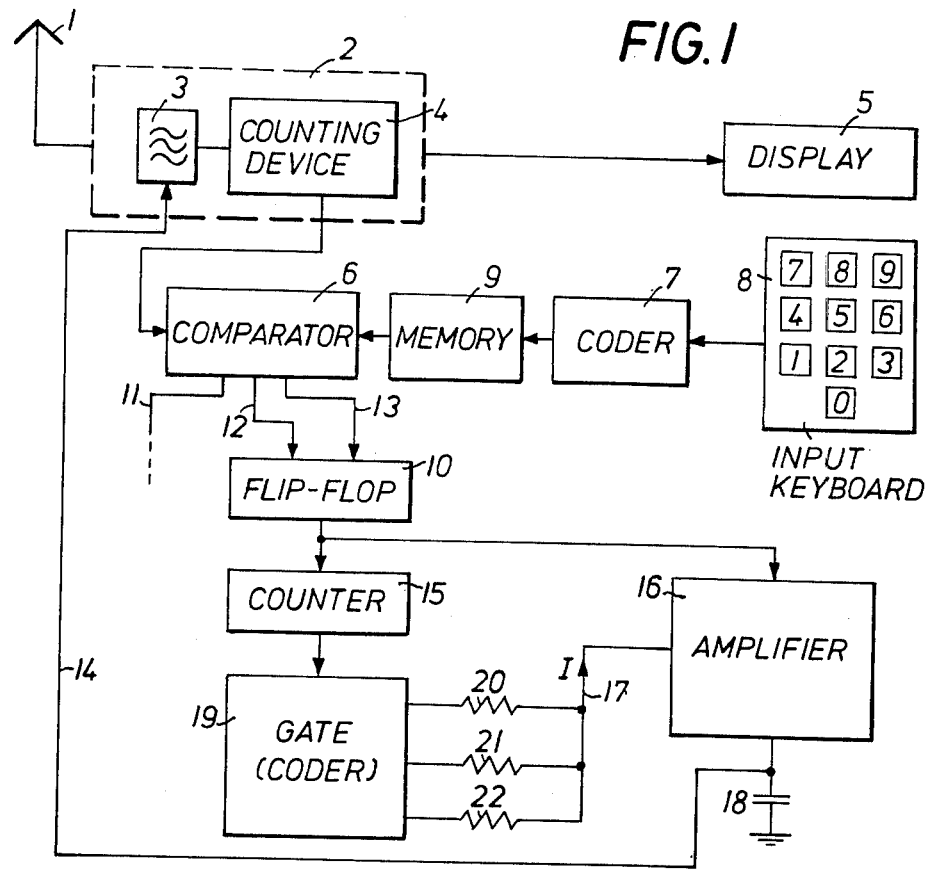
FIG. 1 is a block circuit diagram of one preferred embodiment of the invention.

In the basic circuit diagram shown in FIG. 1, an antenna 1 receives high frequency broadcast signals and feeds them to a high frequency receiver, e.g. a radio receiver 2. This receiver includes, inter alia, a superheterodyne, voltage-controllable oscillator 3 whose frequency can be changed by means of a variable capacitance diode (not shown) whose capacitance can be controlled by a tuning voltage. A counting device 4 is further provided to periodically count the oscillations of the superheterodyne oscillator 3 relating to the intermediate frequency of the receiver. The counter state thus represents the value of the broadcast frequency to which the receiver is presently tuned.

In an indicator 5 the count present in the counting device 4 can be represented in a decimal form. The display 5 can be controlled in a multiplex manner in which the information identifying the individual digits to be displayed are fed to indicator 5 sequentially in time. Multiplex signals are available for the multiplex operation which signals occur, for example, in the form of a logic "0" sequentially in time, each signal representing a respective multiplex phase as this is described in detail in the above-cited application. Each digit is thus associated with a respective multiplex signal, or phase. To provide the desired display and to generate the required multiplex phase signals and control clock pulses, units 4 and 5 could be constituted by the circuit shown in FIG. 2 of U.S. Pat. No. 3,581,065.

For the purpose of tuning to a certain station, the number identifying the desired station or frequency is fed in via an input keyboard 8, or some other input device, beginning with the most significant digit of that number. If, for example, the number is 95.7, the nine is fed in first, followed by the five and then the seven. The signals representing the fed-in number are conducted via a coder 7 to an intermediate memory 9 and from there the representations of each digit are delivered in succession in multiplex operation to a comparator 6. The coder 7 converts the signals into, for example, a BCD code, in which form the digits of the number representing the counter state of counting device 4 are also available. Comparator 6 receives, in succession in the same multiplex operation, the signals representing the counter state of counting device 4. Comparison between the two numbers is thus made in multiplex operation, i.e. the corresponding digits of the two numbers are compared sequentially in time, the comparison beginning with the most significant digit. Units 6, 7, 8 and 9 can have the form, and operate in the manner, disclosed in the above-cited earlier application, the necessary multiplex control signals being provided by device 4.

The comparator 6, for example a commercially available 4-bit, type 7485 comparator, is provided with three outputs 11, 12 and 13, which are associated with the possible comparison results, respectively, "equality of the digits", providing a signal at output 11, and the two inequality results "digits of the first number greater than digit of the second number", providing a signal at output 12, and "digit of the first number less than digit of the second number", providing a signal at output 13. The two latter outputs, 12 and 13, influence a bistable flip stage, e.g. a flip-flop 10. The output of flip-flop 10 is connected to the input of an amplifier circuit 16 to generate at the amplifier output the tuning voltage. The existing stable state of the flip-flop determines the direction of change of the tuning voltage. In this connection, the first mentioned output 11 of comparator 6 for the equality result will initially not be considered.

Each one of the two possible stable states of flip-flop 10 is associated with a respective one of the two inequality results of comparator 6. Upon a change from one inequality result to the other, flip-flop 10 thus reverses its stable state. These changes in state are counted by a counter 15 to the output of which is connected a coder 19. Coder 19, for example, has three outputs which are each connected, via a respective resistor 20, 21, or 22, to a bus bar 17 leading to the above-mentioned amplifier 16. The current I flowing in bus bar 17 determines the level of the charging or discharging current supplied to a capacitor 18 connected to the output of amplifier 16. The voltage across capacitor 18 is the tuning voltage for the superheterodyne oscillator 3 and is fed thereto via a line 14. Whether the capacitor 18 is discharged or charged, depends on the stable state of flip-flop 10.

Coder 19 converts the counter state of counter 15 which is available, for example, in BCD code, to, for example, a 1-of-3 code. In dependence on the counter state of counter 15, one of the three outputs of coder 19 is thus switched to present a binary "1" potential. The resistors 20, 21, and 22 are selected to have different resistance values in a ratio, for example, such as 1:10:100, i.e. the resistance of resistors 21 and 22 being 10 times and 100 times, respectively, that of resistor 20.

At the beginning of the tuning process, the relatively small resistor 20, for example, is connected to a binary "1" potential so that a relatively large current I flows to amplifier 16. As a result, the voltage across capacitor 18 will change relatively quickly so that the tuning process initially takes place at a high rate of frequency change.

If now, in the course of the tuning process, the inequality result changes for the first time, i.e. the state of flip-flop 10 changes once and the counter state of counter 15, which at the beginning of the tuning process had been set to zero, changes to a count of "one", only resistor 21, for example, receives a binary "1" potential, while the other two resistors 20 and 22 are switched off, or open circuited. Since resistor 21 has a larger resistance value than resistor 20, a smaller current flows through line 17 to amplifier 16 after the first change in the inequality result. Tuning now takes place at a tuning rate which has been reduced by a ratio of 1:10. Upon the next change in the inequality result, another counting pulse is delivered to counter 15. Now the relatively large resistance of resistor 22 becomes effective. The tuning rate is thus again reduced by a ratio of 1:10.

Although FIG. 1 shows an arrangement for varying the tuning rate in only three stages, it is a matter of course that a different number of stages and resistors can also be selected.

In the selection of the tuning rate, care must be taken that it is not made too high since otherwise equality between the two numbers to be compared may, under certain circumstances, not dependably be attained. It must be considered that the oscillator oscillations are counted periodically and that new counting results therefore are available only at certain points in time. The adjustment time for one decade step, i.e. the time required for the oscillator frequency to change by one decade step during the tuning process, must be greater than the time required to supply a new counting result to superheterodyne oscillator 3 so that the respective step or the respective digit, respectively, can be considered during the tuning process.

Figures 4, 5:
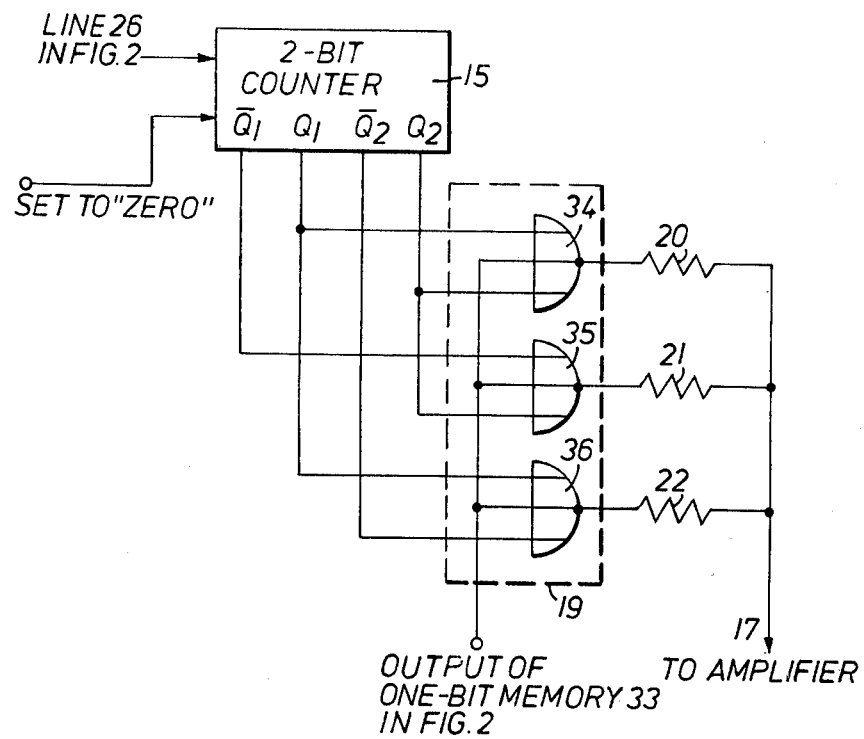
FIG. 4 is a circuit diagram of a portion of the circuit of FIG. 2.
FIG. 5 is a logic diagram of the circuit of FIG. 4.

FIG. 2 shows a portion of the circuit of FIG. 1. The 4-bit comparator 6 receives, in multiplex operation, the corresponding digits of the number fed in via keyboard 8 and of the number representing the presently received frequency, each one being in BCD code and being supplied via 4 lines. The three outputs 11, 12 and 13 of comparator 6 lead to a gating circuit 31 which controls a 1-bit memory 33 as well as, via lines 23a and 23b, flip-flop 10. As already mentioned, the state of flip-flop 10 depends on the inequality results at outputs 12 and 13. The gate circuit 31 is shown in FIG. 5 of the earlier U.S. application Ser. No. 708,754.

Upon equality between the currently-supplied digits of the two numbers, a logic "1" appears at the output 11 and this is fed to memory 33 only under certain conditions and is stored therein. As described in detail in the above-cited earlier application, equality with respect to the first, i.e. most significant, digit is always evaluated first. Only when the most significant digits of the two numbers are identical, will the comparison of the next most significant, or second, digit be evaluated. The outputs from comparator 6 for any desired digit are evaluated only if all higher order, or more significant, digits are already identical. If, for example, at the beginning of the comparison only the third digits of the two numbers accidentally coincide, this coincidence must not be evaluated because the more significant digits differ from one another.

This condition is satisfied by the operation of gating circuit 31 in conjunction with gate 32. Gate 32 is controlled during the multiplex phase signal of the first digit, or position, via an inverter 32a. Gate 31 can correspond to gate 60 shown in FIG. 5 of the earlier application, and circuit 31 can include the components 55 and 61 of FIG. 5 of the earlier application. As described in detail in the above-cited earlier application, gating circuit 31 permits a logic "1", which occurs upon coincidence at output 11, to pass to memory 33 only if a logic "1" reaches gate 32 from inverter 32a or from the output of memory 33, i.e. either the first digit is being compared or the preceding comparison result transferred into memory 33 was a positive one.

Memory 33 is activated by one clock pulse during each multiplex phase. Each such clock pulse causes the logic signal then emitted by gating circuit 31 to be stored in memory 33 and to be available at its output to control gate 32.

In FIG. 2 the inequality results at the outputs 12 and 13 of comparator 6 are supplied to flip-flop 10 via gating circuit 31 and lines 23a and 23b. One clock pulse is furnished to flip-flop 10 via line 26 at each multiplex phase so as to flip flip-flop 10 to that stable state determined by the nature of the respective inequality result.

Since the respective stable position of flip-flop 10 determines the direction of the tuning process, the output of flip-flop 10 is connected to amplifier 16, as shown in FIG. 1.

Moreover, the output of flip-flop 10 is connected, via a line 24, with a differentiating circuit 30 which feeds a counting pulse to counter 15 after each change of state of flip-flop 10. Through the already mentioned line 26, the counter receives one clock pulse for counting with each multiplex phase. Furthermore, counter 15 is set to its zero state at the beginning of each tuning process by a signal applied to terminal 25.

In dependence on the counter state of counter 15, the coder 19, which has already been mentioned in connection with the description of FIG. 1, applies a binary "1" potential to one of the different resistors 20, 21, and 22 so that a current, whose magnitude depends on how often the inequality result of comparator 6 has changed, flows to amplifier 16.

Amplifier 16 may be, for example, an integrated module CA 3080 manufactured and sold by RCA. This is an amplifier which feeds capacitor 18 with the current it receives from line 17.

Figure 3:
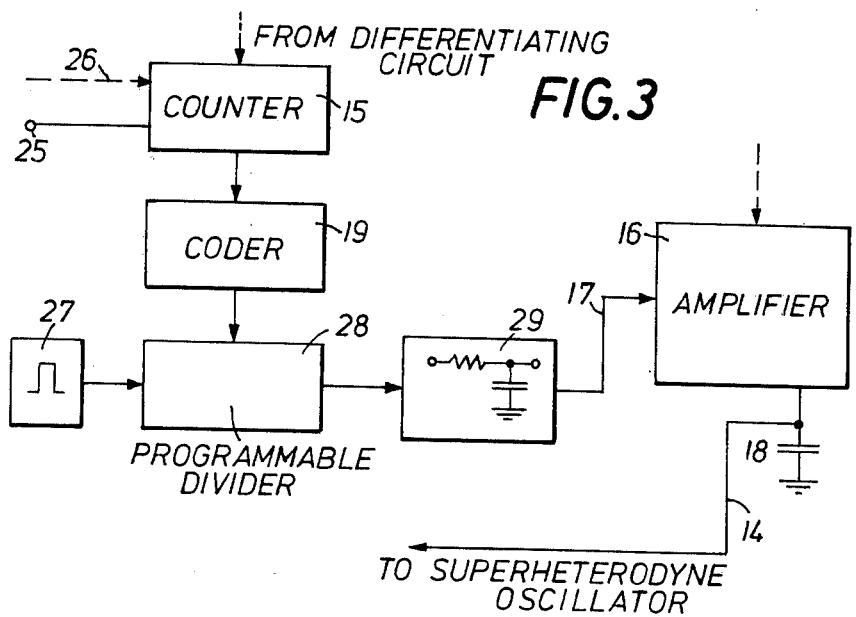
FIG. 3 is a block diagram of a modified portion of the circuit of FIG. 2, representing another embodiment of the invention.

FIG. 3 illustrates a modified portion of the circuit of FIG. 2 according to another embodiment of the invention. A pulse generator 27 is provided which produces pulses at a constant frequency. Via a programmable divider 28, these pulses are fed to a converter 29, e.g. a low-pass filter or integrator, which generates a direct voltage or direct current, respectively, in dependence on the frequency of the pulses it receives. Via line 17, the resulting direct current flows to amplifier 16 which, in the above-described manner, charges or discharges, respectively, capacitor 18, thus generating the tuning voltage fed to the superheterodyne oscillator via line 14.

The graduated variation in the rate of tuning voltage, and hence tuning frequency, change is effected in the circuit of FIG. 3 in that the dividing ratio of the programmable divider 28 is set and changed in dependence on the number of changes in the inequality results. Counter 15 again counts the number of changes in the inequality results and enables coder 19, which here effects such a conversion of the counter state present in a BCD code that coder 19 is able to set the dividing ratio in dependence on the counter state.

At the beginning of the tuning process, i.e. at the counter state of zero, the dividing ratio is relatively small, i.e. the frequency of the pulses fed to converter 29 is high. Thus the rate of tuning is also high. If the counter state is "one", the dividing ratio of the programmable divider 28 is increased. With identical pulse width, the frequency of the pulses fed to converter 29 is thus reduced, for example, by the factor 1:10 so that the rate of tuning is also correspondingly less. After the next change in the inequality result, when the counter state is "two", the dividing ratio is reduced further so that the tuning rate is again reduced, etc. until equality of the two numbers has been attained.

Care must be taken in connection with the frequency division that the pulse width of the pulses whose frequencies have been divided down remains substantially unchanged so that the direct voltage or direct current, respectively, appearing at the output of converter 29 is dependent on the frequency of the pulses. Converter 29 may be formed, in the simplest case, by a low-pass filter.

FIG. 4 shows a 2-bit counter 15, resistors 20, 21, 22 and a coder 19 connected between the outputs of the counter 15 and the resistors 20, 21, 22. The coder 19 includes three NOR-gates 34, 35, 36. Each NOR-gate has three inputs. One input of each NOR-gate is connected to a bus bar. This bus bar is connected with the output of the one-bit memory 33 in FIG. 2. So the gates 34, 35 and 36 are persistent blocked when there is coincidence between all digits of the two numbers which are compared in the comparator 6 in FIG. 2. The other inputs of the gates 34 to 36 are connected with the outputs $\overline{Q}_1$ and $\overline{Q}_2$ and the inverted outputs $Q_1$ and $Q_2$ of the counter 15 in the shown manner. FIG. 5 shows the logic diagram of the circuit of FIG. 4. The state No. 1, 2 and 3 represent a 1-of-3 code. The state No. 4 is the maximum count state of counter 15. In the case of state No. 4 all outputs of the coder 19 are blocked so that the current flow through all resistors 20, 21 and 22 is prevented.

It will be understood that the above description of the present invention is susceptible to various modifications, changes and adaptations, and the same are intended to be comprehended within the meaning and range of equivalents of the appended claims.

What is claimed is:

1. In a tuning circuit for a high frequency receiver, which circuit includes a voltage controllable superheterodyne oscillator arranged to receive a control voltage and to produce an oscillation whose frequency is determined by the value of the control voltage and determines the broadcast frequency to which the receiver is tuned, a counter connected to sense the frequency of the oscillations being generated by the oscillator and to produce therefrom a count state in the form of representations of the digits of a first decimal number identifying the broadcast frequency to which the receiver is currently tuned, input means for generating representations of the digits of a second decimal number identifying the broadcast frequency to which it is desired to tune the receiver, and a comparison circuit for comparing the decimal number representations being produced by the counter and the input means in order to vary the control voltage in a direction to cause those two number representations to coincide, the comparison circuit including a comparator capable of comparing the representations of one digit of each of two numbers and having two inputs connected, respectively, to the counter and to the input means, the comparator being arranged to receive, at one of its inputs, each digit representation produced by the counter, starting with the most significant digit, and, at the other of its inputs, simultaneously therewith each digit representation of corresponding significance generated by the input means, the comparator including a first output providing a signal when the digit representations at its inputs are identical, a second output providing a signal when the digit representation at its one input represents a value larger than that of the digit representation at its other input, and a third output providing a signal when the digit representation at its one input represents a value smaller than that of the digit representation at its other input, the improvement comprising: tuning voltage adjustment means connected to said comparator outputs and responsive to the number of sequences of termination of a signal at one of said second and third outputs and subsequent initiation of a signal at the other of said second and third outputs for varying the control voltage at a rate inversely proportional to such number of sequences.

2. An arrangement as defined in claim 1 wherein said adjustment means comprises a sequence counter connected for counting the number of such sequences and having its count state set to zero at the beginning of each tuning operation.

3. An arrangement as defined in claim 2 wherein said adjustment means further comprises a logic gate connected to the output of said sequence counter and having a number of outputs equal to a selected number of desired control voltage variation rates, said gate being arranged to provide a certain logic potential at one of its outputs in dependence on the count state of said sequence counter.

4. An arrangement as defined in claim 3 wherein said comparison circuit includes an amplifier arranged to provide an output signal which effects variation of the control voltage, and said adjustment means further comprise a plurality of resistors having respectively different resistance values and each connected between a respective output of said gate and said amplifier for causing the control voltage variation rate to have a value determined by the resistance value of that resistor whose associated gate output is providing the certain logic potential.

5. An arrangement as defined in claim 4 wherein the comparison circuit further includes a capacitor connected to receive the output signal from said amplifier so that the voltage thereacross constitutes the control voltage, said amplifier being arranged for supplying said capacitor with a charging or discharging current proportional to the current flowing through that one of said resistors whose associated gate output is providing the certain logic potential.

6. An arrangement as defined in claim 4 wherein said amplifier is connected to said second and third comparator outputs for causing the direction of variation of the control voltage to be determined on the basis of which one of said second and third comparator outputs is providing a signal.

7. An arrangement as defined in claim 4 wherein said gate is arranged to cause its outputs to be blocked at a selected maximum count state of said sequence counter for preventing current flow through any of said resistors.

8. An arrangement as defined in claim 4 wherein said logic gate is arranged to have its outputs blocked when there is coincidence between all digits of the two numbers.

9. An arrangement as defined in claim 2 wherein said adjustment means comprises a programmable frequency divider connected to have its dividing ratio determined by the counter state of said sequence counter in a manner such that the dividing ratio increases with increasing counter state.

10. An arrangement as defined in claim 9 wherein said adjustment means further comprises means for producing square wave oscillations of a constant frequency connected to feed such oscillations to said divider.

11. An arrangement as defined in claim 10 wherein said adjustment means comprises a digital-analog converter connected to the output of said divider and providing an output voltage whose value determines the magnitude of the rate of variation of the control voltage.

* * * * *